(12) United States Patent
Faick et al.

(10) Patent No.: US 6,242,901 B1
(45) Date of Patent: Jun. 5, 2001

(54) TRUE AVERAGE WIDE DYNAMIC RANGE MICROWAVE POWER SENSOR USING DIODE STACK ATTENUATOR-DIODE STACK

(75) Inventors: John C. Faick; Eric R. Ehlers; Ronald J. Hogan, Jr., all of Santa Rosa; Ajay A. Prabhu, Rohnert Park, all of CA (US)

(73) Assignee: Agilent Technologies Inc., Palo Alto, CA (US)

( * ) Notice: Subject to any disclaimer, the term of this patent is extended or adjusted under 35 U.S.C. 154(b) by 0 days.

(21) Appl. No.: 09/289,295

(22) Filed: Apr. 9, 1999

(51) Int. Cl.[7] .......................... G01R 23/04; G01R 15/00; G01S 3/02
(52) U.S. Cl. .......................... 324/95; 324/115; 324/76.14
(58) Field of Search .............................. 324/95, 131, 132, 324/115, 119, 103 P, 76.14; 340/600; 363/59, 68

(56) References Cited

U.S. PATENT DOCUMENTS

| 4,207,518 | * | 6/1980 | Hopfer | 324/95 |
| 4,873,484 | * | 10/1989 | Adam | 324/95 |
| 5,204,613 | * | 4/1993 | Cripps | 324/95 |
| 5,714,900 | * | 2/1998 | Ehlers | 327/325 |

* cited by examiner

Primary Examiner—Glenn W. Brown
Assistant Examiner—Anjan K. Deb

(57) ABSTRACT

The invention provides a true average, wide dynamic range microwave power sensor using a diode-stack-attenuator diode stack technology. The invention provides a diode stack microwave power sensor which includes an RF signals receiver having wide dynamic power ranges; a low power sensor path connected between the receiver and ground for sensing relatively low power RF input signals. The low power sensor path includes one or more stacked RF diodes in which a number of diode pairs may be coupled to ground through respective capacitors. An impedance network including attenuating resistors R1 and R2 are connected in series between the receiver and ground. A high power sensor path is connected in parallel between the attenuating resistors R1 and R2 and ground for sensing attenuated relatively high power RF input signals. The high sensor path includes a second stacked RF diode in which a second number of stacked diode pairs are coupled to ground through a respective capacitor, and in which the sensor diode operates in the square law region and senses the power levels over the wide dynamic ranges of the received RF signals.

5 Claims, 4 Drawing Sheets

TRUE AVERAGE WIDE DYNAMIC RANGE MICROWAVE POWER SENSOR USING DIODE STACK ATTENUATOR-DIODE STACK

FIELD OF THE INVENTION

The invention relates to power level measurement devices and, more specifically, to devices for microwave power level measurements on signals with high peak to average ratios over a wide dynamic range.

BACKGROUND OF THE INVENTION

Microwave signals with many kinds of modulation formats, such as various forms of CDMA signals, have high but arbitrary peak to average ratios over a very wide dynamic range. These signals pose serious challenges to accurate and rapid power level measurements over wide dynamic ranges.

Some methods have been described that attempt to place the power sensing path in the "square law" region (see U.S. Pat. No. 4,943,764) or otherwise improve power sensor performance (see U.S. Pat. No. 5,204,613). However, the accuracy afforded measurement of modulated signals with high peak to average ratios is not satisfactory.

Another technique which attempts to accurately perform wide dynamic range microwave power measurements for modulations with high peak-to-average ratios involves characterizing a continuous wave (CW) sensor for a given kind of modulation over the power range of interest, for example −70 dBm to +20 dBm. This technique has the drawback of being accurate only to the extent that the modulation being measured is fairly similar to the modulation form for which the sensor was originally charaterized. Because commercial formats such as CDMA are changing rapidly, a sensor characterized for one form of modulation risks obsolescence.

No currently known methods are entirely satisfactory from an accuracy or application standpoint. What is needed is a power measurement device that makes measurements of signals over a 90 dB dynamic range (about −70 dBm to about +20 dBm) with improved accuracy in measuring high peak average power ratio signals above −20 dB.

SUMMARY OF THE INVENTION

The invention provides a power measurement device that measures signals over a wide dynamic range with improved accuracy in measuring high peak average power signals above −20 dBm.

The invention provides a diode stack microwave power sensor which includes an RF signals receiver having wide dynamic power ranges; a low power sensor path connected between the receiver and ground for sensing relatively low power RF input signals. The low power sensor path includes one or more stacked RF diodes in which a number of diode pairs may be coupled to ground through respective capacitors. An impedance network including attenuating resistors R1 and R2 are connected in series between the receiver and ground. A high power sensor path is connected in parallel between the attenuating resistors R1 and R2 and ground for sensing attenuated relatively high power RF input signals. The high sensor path includes a second stacked RF diode in which a second number of stacked diode pairs are coupled to ground through a respective capacitor, and in which the sensor diode operates in the square law region and senses the power levels over the wide dynamic ranges of the received RF signals.

The invention further provides a diode stack microwave power sensor network. The network includes RF signal receiver having wide dynamic power ranges; a low power sensor path for sensing relatively low power RF input signals, the low power sensor path including first stacked RF diode, which may be single or stacked, having a first number of diode pairs coupled to ground through receptive capacitors. The network also includes an impedance network with a number of attenuating resistors R1, R2, ... RN and ground for sensing different levels of attenuated relatively higher power RF input signals. The higher power sensor paths each include a second stacked RF diode which has an arbitrary number of diode pairs coupled to ground through a respective capacitor, and in which the sensor diode operates in the square law region, sensing the power levels over the wide dynamic ranges of the received RF signals.

BRIEF DESCRIPTION OF THE DRAWINGS

The accompanying drawings, which are incorporated within and form a part of this specification and in which like numerals represent like components, illustrate the preferred embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

The invention provides a power sensor which includes a diode-stack-attenuator-diode stack configuration so as to maintain the signal to the sensor diodes in the diode "square law" region.

Figure 1:
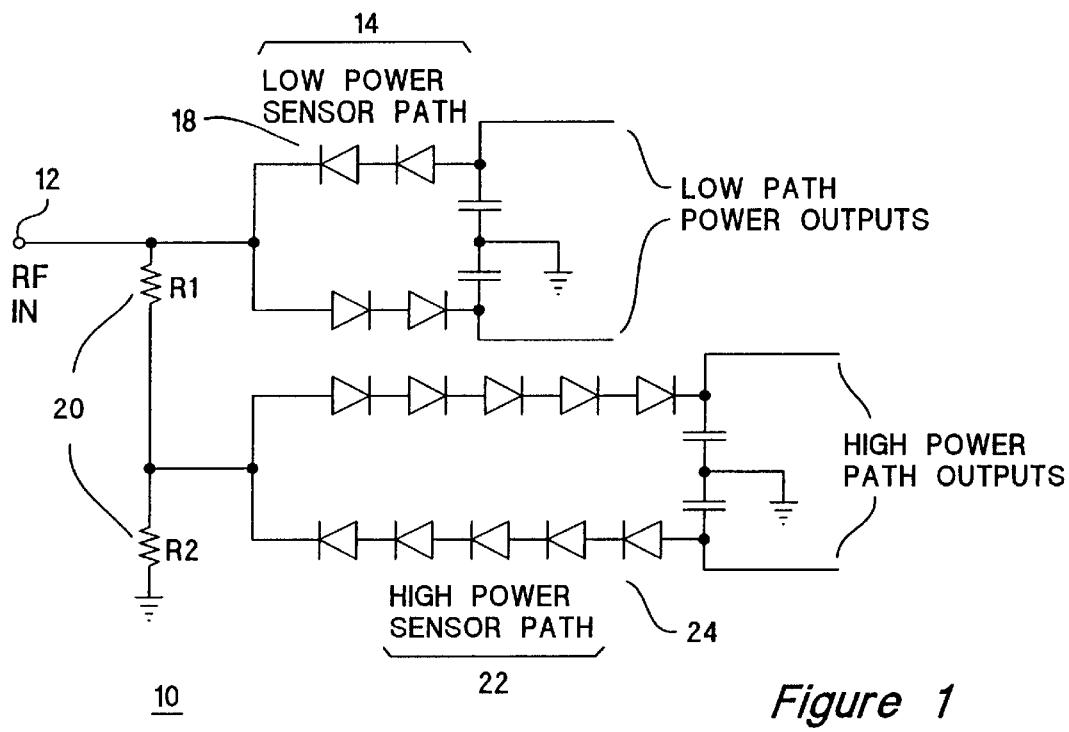
FIG. 1 shows one implementation of a true average wide dynamic range microwave power sensor incorporating diode stack attenuator diode stack technology.

FIG. 1 depicts a diode stack microwave power sensor 10 which includes an input means 12 for receiving RF input signals having wide dynamic power ranges;

a low power sensor path 14 connected between the input means 12 and ground for sensing relatively low power RF input signals, the low power sensor path 14 including first stacked RF diode means 18 having a first number of diode pairs coupled to ground through respective capacitors;

an impedance network 20 including attenuating resistors R1 and R2 connected in series between the input means 12 and ground;

a high power sensor path 22 connected in parallel between the attenuating resistors R1 and R2 and ground for sensing attenuated relatively high power RF input signals, the high sensor path 22 including second stacked RF diode means 24 having a second number of stacked diode pairs coupled to ground through a respective capacitor;

the sensor diode means operating in the square law region and sensing the power levels over the wide dynamic ranges of the received RF signals.

As can be seen by referring to FIG. 1, the inventive configuration includes an anti parallel pair of stacked sensor diodes in parallel with the series combination of resistors R1 and R2. Because a 50 ohm impedance is the most common transmission line impedance at microwave frequencies, the resistance of R1 and R2 in parallel with the video resistance of the low power path diode stack is typically set to 50 ohms to create a low reflection termination for the incoming signal.

More generally, an additional impedance-matching element may be used in parallel with the video resistance of the diodes, as well as in parallel to the sum of R1 and R2, such that there is a close match at the RF input to 50 ohms. The number of diodes in the low power path diode stack can range from one (a standard anti-parallel pair configuration) to N, with higher N giving less sensitivity to low level signals, but a greater dynamic range of the "square law" operating region for the low power path. Although not depicted, a low power path with a single diode is considered to be a configuration covered within this invention as taught herein.

The high power sensor path senses a signal whose RF voltage is proportional to R2/ (R1+R2) times the voltage of the original RF signal across the series combination of R1 and R2. Because the voltage out of the diode stack in the high power sensor is proportional to the square of the RF voltage (the RF power) across it when the diodes are in their square law region, the DC output of the high power path will be proportional to the square of R2/ (R1+R2) times the RF power.

For example, using a value of 2.5 ohms for R2 and 47.5 ohms for R1 provides RF power across R2 that is .0025(26 dB down) from the RF power across a 50 ohm load. Hence the diode stack will output a signal .0025 that of what it would have give for the same diode stack which monitored the RF power across the entire 50 ohm load.

The diode stack can be N diodes long, where N ranges from 1 to N, the higher values of N extending the "square law" region of operation of the high power path, but degrading power sensitivity. By utilizing a diode stack in the high power-path with a value of N greater than 1, two major advantages are gained. One advantage is the "square law" region of the high power path will have an extended dynamic range. Although a simple analysis would indicate that taking the "square law" dynamic range of an anti-parallel diode pair low power path (about −70 dBm to −20 dBm) then adding 40 dB of attenuation in front of an anti-parallel pair to form the higher power path with a "square law" region 40 dB higher in power (−30 dBm to +20 dBm) would generate a useful sensor that stayed in "square law" for a full 90 dB (−70 to +20 dBm). However, a problem with this approach is the large amounts of noise on the low power portion of the high power path, which necessitates slower measurement and increased averaging in the −20 dBm to −10 dBm range, thereby compromising the ability to handle high speed data acquisition.

Figure 5:
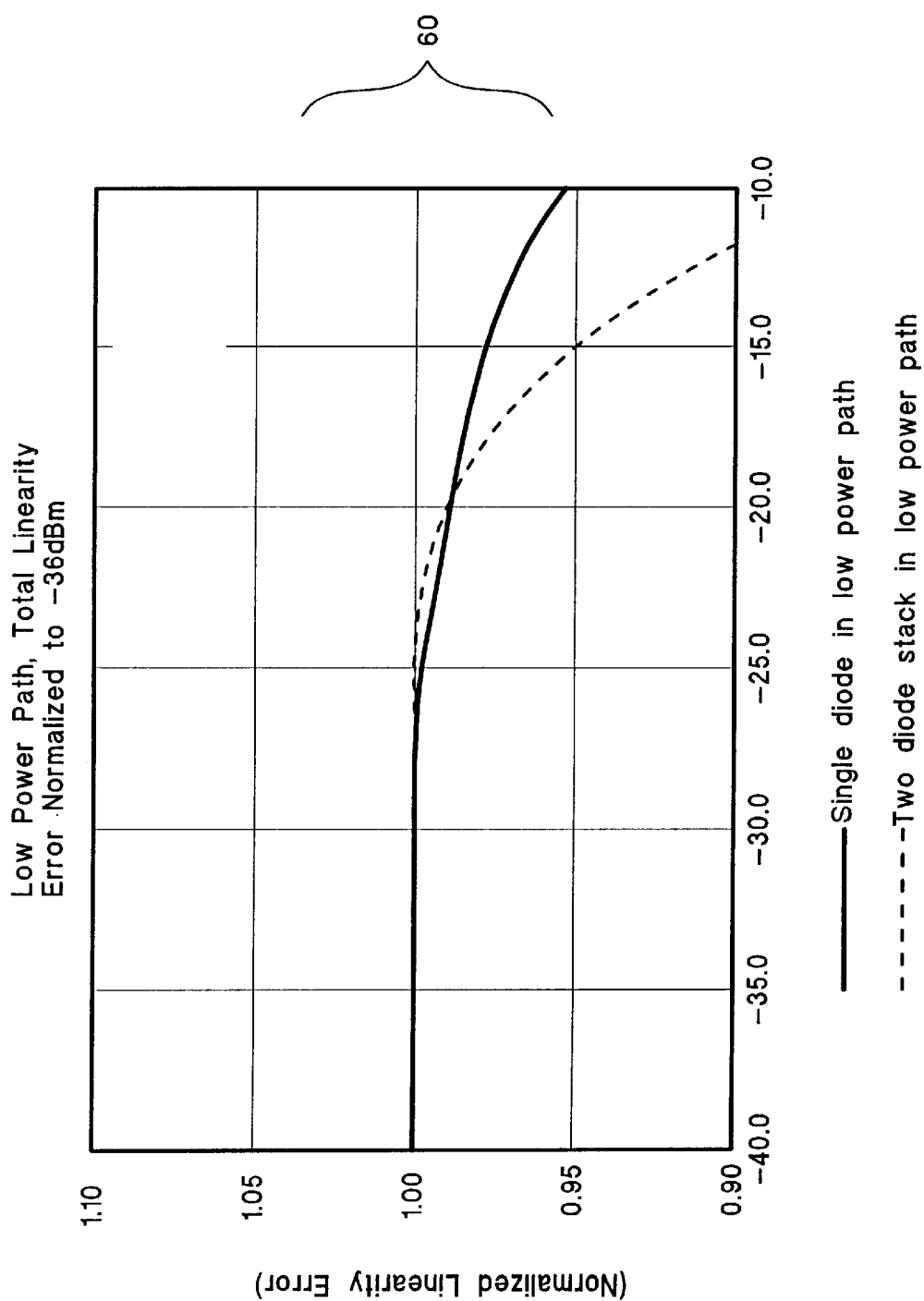
FIG. 5 shows a graph of results attributable to the invention.

A second advantage is that the "square law" region of operation of the higher power path is moved up in power, necessitating less attenuation of the RF signal in the resistive divider formed by R1 and R2. Lower values of resistive attenuation are advantageous, because it is difficult to get high values of attenuation (30,40 and 50 dB) in a small area that remains constant at high frequencies over wide bandwidths. Special compensation techniques may be employed to obtain flat sensor performance versus frequency even for resistive attenuations less than 30 dB. An example of the extension of the "square law" operating range in the low power path by use of a diode stack is illustrated in FIG. 5, in which linearity results for a two diode stack anti-parallel pair are compared to results for a standard anti-parallel diode pair. The linearity results for the two diode stack anti-parallel pair are much better at higher levels than for the standard anti-parallel pair. Diode stacks used in the high power path produce similar results.

Figure 2:
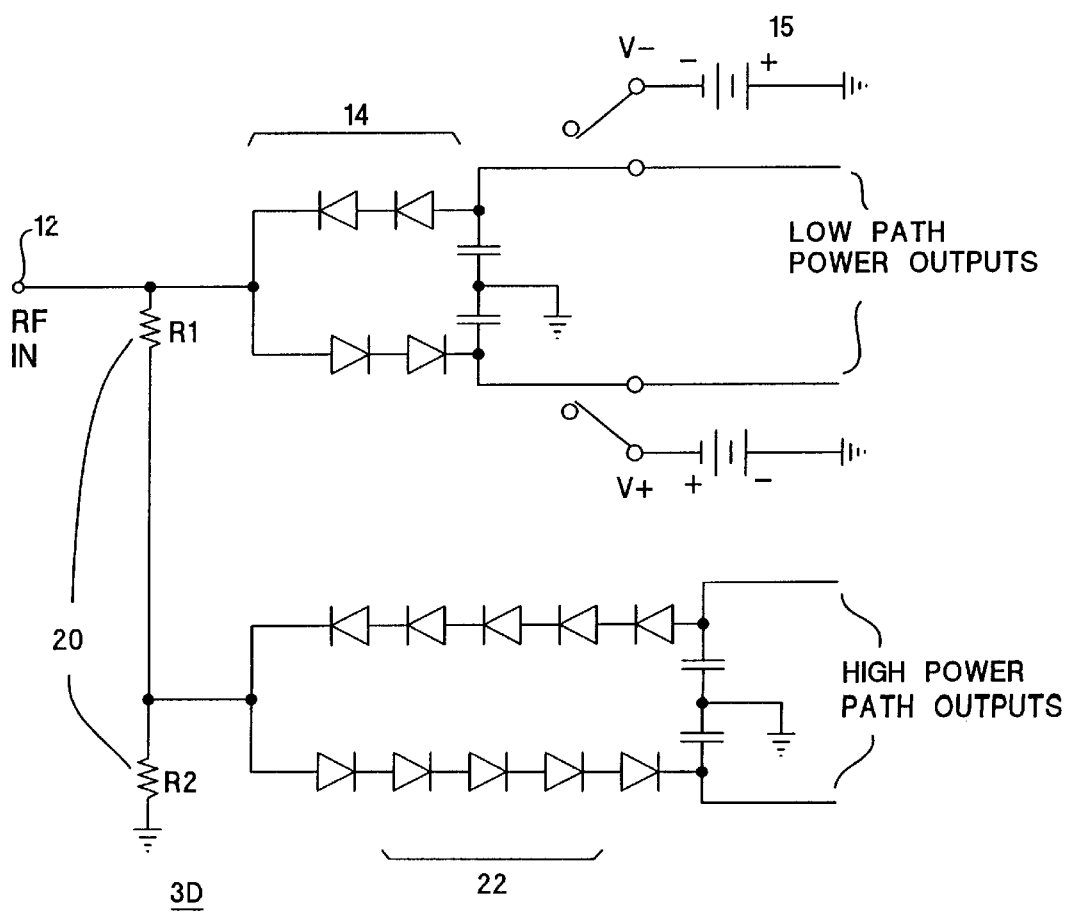
FIG. 2 shows another implementation of a microwave power sensor incorporating diode stack attenuator stack technology.

FIG. 2 shows a second embodiment 30 in which the inventive configuration includes switches 15 connected to the outputs of low power path diodes such that DC voltages can be switched onto the low path diode outputs to reverse bias them when the low power path is not in use and the high power path is making measurements. Through the reverse biasing of the low power path diodes when they are not in use and when high power RF signals are being measured, the low power path diode impedance will remain high and constant, eliminating the power limiting and harmonic generation problems that these diodes would otherwise cause.

Figure 3:
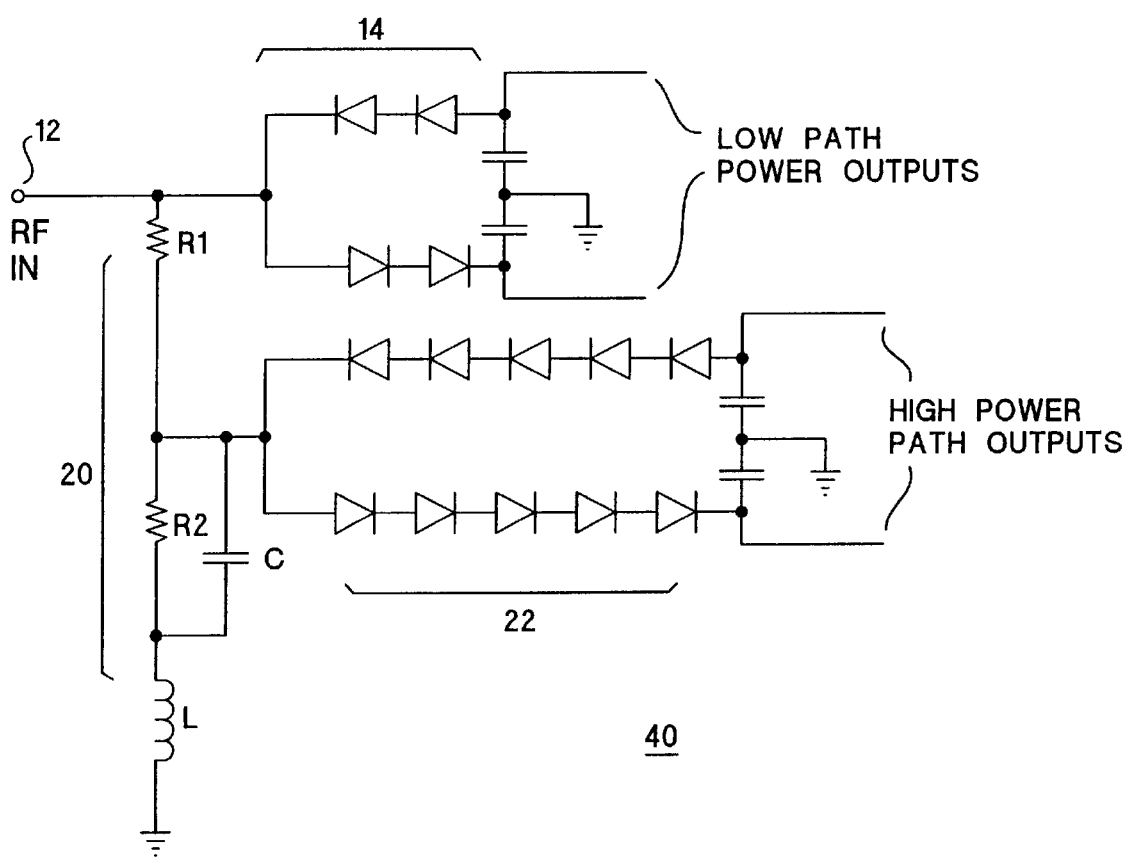
FIG. 3 shows another implementation of the invention useful in obtaining flatter cal factor versus frequency.

FIG. 3 shows a third embodiment 40 of the invention, by way of illustrating the obtaining a flatter cal factor versus frequency by means of the invention. Because a finite inductance L exists between the ground and the resistor R2, FIG. 3 shows this configuration. The impedance ratio of Z2/(Z1+Z2) will set the voltage divider ratio between the high power path and the low power path, with the impedance of ZI being R1, and the impedance of Z2 R2+jwL. This finite inductance L will cause the resistive attenuator to attenuate the RF signal less between the low power path and the high power path, leading to steadily increasing output voltage from the higher power path diodes for the same level of RF input signal as the frequency is increased (increasing cal factor versus frequency). To minimize this increase in cal-:factor versus frequency, a compensation scheme can be introduced to decrease the voltage developed across resistor R2 The capacitor C in parallel with resistor R2 is one technique to keep the impedance ratio Z2/ (Z1+Z2) nearly constant as frequency is varied . As the voltage increases across the inductor L, the voltage can be made to decrease on a similar amount across the parallel combination of R2 and C by the proper choice of the value C.

Figure 4:
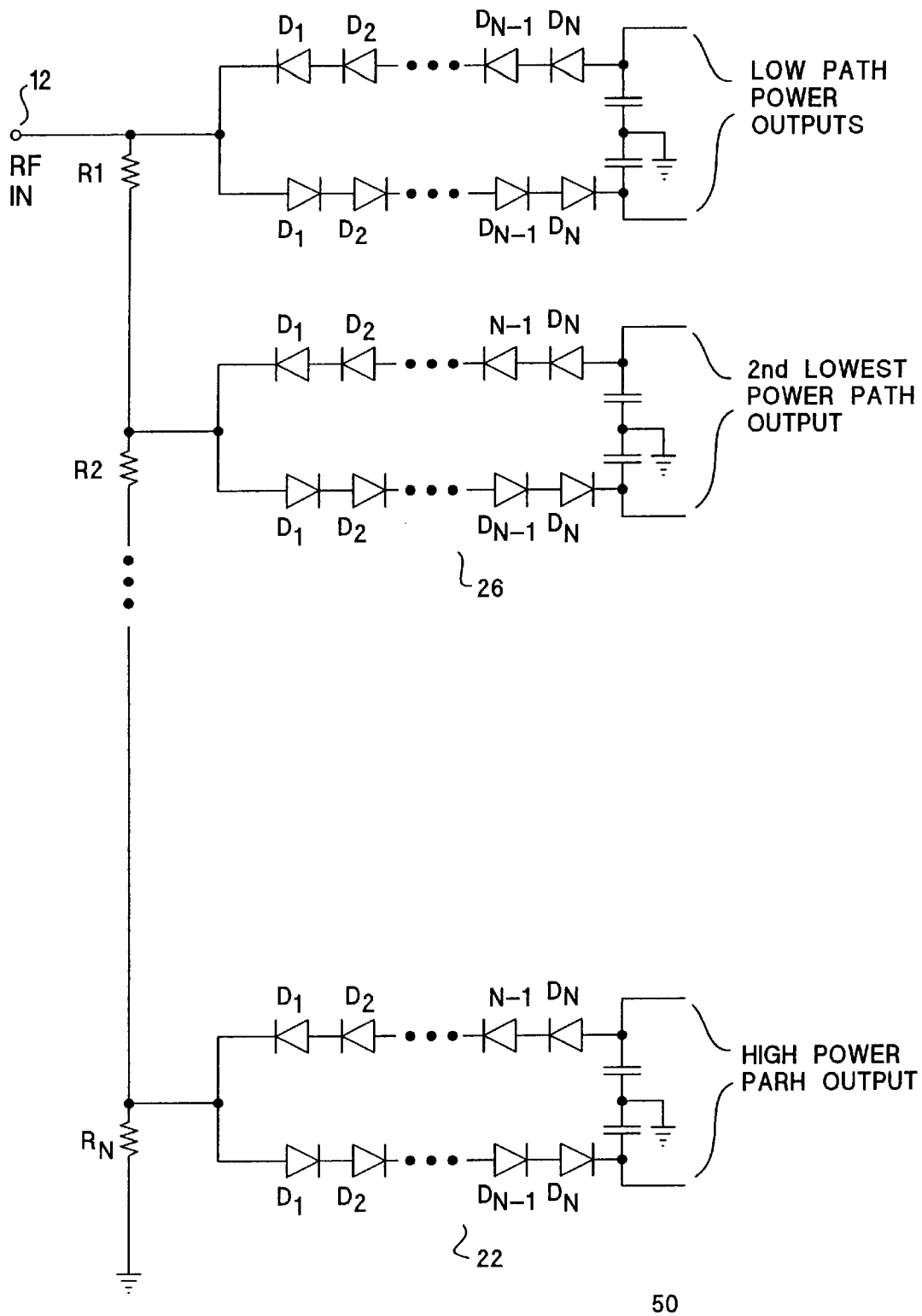
FIG. 4 shows another highly generalized implementation of the invention.

Another embodiment of the invention 50 is shown in FIG. 4, which represent a generalized concept of the diode-stack-attenuator-diode stack which includes an arbitrary number of diodes in each stack (1 to N) as well as arbitrary numbers of diode stacks optimized for making measurements at different power levels.

A diode stack microwave power sensor network includes input means 12 for receiving RF signals having wide dynamic power ranges; a low power sensor path 14 connected to the input means for sensing relatively low power RF input signals, the low power sensor path including first stacked RF diode means 18 having a first number of diode pairs coupled to ground through receptive capacitors; an impedance network 21 including a number of attenuating resistors R1, R2, . . . RN and ground for sensing different levels of attenuated relatively higher power RF input signals, the higher power sensor paths 22,26 each including second stacked RF diode means having an arbitrary number of diode pairs coupled to ground through a respective capacitor, the sensor diode operating means in the square law region and sensing the power levels over the wide dynamic ranges of the received RF signals.

The values of N can be different between different diode stacks. For example, the high power diode path might have a 5 diode stack, while the low power path may have only a 1 or 2 diode stack. A significant advantage of this configuration is that the overlap of the "square law" regions for the different ranges can be made greater to provide greater measurement accuracy for high peak to average ratio signals while still maintaining good noise performance in the low power portion of each of the ranges. Another advantage is the maintenance of a similar overlap of the square law region as with the two path sensor, and provide, in addition, significantly higher attenuation in the front of the high power path extending the overall "square law" dynamic range of the sensor to 90 dB or more. It should be noted that although the depiction omits cluttering features, the diode-stack-attenuator diode stack provides the ability to use capacitative compensation across the resistors R1 through RN if so desired to improve the cal factor versus frequency performance as shown in FIG. 3.

In order to simplify the depiction for all embodiments set forth herein, the DC blocking capacitor (often included at the RF input of power sensors) and the resistive attenuator typically included between the RF input and the diode sensing elements to improve the standing wave ratio (SWR) and decrease harmonic generation, have not been shown. It is obvious to those of average skill in the art that these features are useful and the invention taught herein includes configurations with these elements within the scope of the claims appended hereto.

What is claimed is:

1. A diode stack microwave power sensor comprising:

input means for receiving RF input signals from a source characterized by a transmission line impedance;

a low power sensor path connected between the input means and ground for sensing relatively low power RF input signals, the low power sensor path including first stacked RF diode means having a first number of diode pairs coupled to ground through respective capacitors;

an impedance network including attenuating resistors R1 and R2 connected in series between the input means and ground, said impedance network providing a path to ground having an impedance equal to said transmission line impedance;

a high power sensor path connected between the attenuating resistors R1 and R2 and ground for sensing attenuated relatively high power RF input signals, the high sensor path including second stacked RF diode means having a second number of stacked diode pairs coupled to ground through a respective capacitor, the sensor diode means operating in the square law region and sensing the power levels over the wide dynamic ranges of the received RF signals.

2. A power sensor as in claim 1 wherein the high power sensor path senses an RF input signal voltage proportional to R2/(R1+R2) times the input RF signal voltage.

3. A diode stack microwave power sensor comprising:

input means for receiving RF input signals having wide dynamic power ranges;

a low power sensor path connected between the input means and ground for sensing relatively low power RF input signals, the low power sensor path including first stacked RF diode means having a first number of diode pairs coupled to ground through respective capacitors;

an impedance network including attenuating resistors R1 and R2 connected in series between the input means and ground;

a high power sensor path connected between the attenuating resistors R1 and R2 and ground for sensing attenuated relatively high power RF input signals, the high sensor path including second stacked RF diode means having a second number of stacked diode pairs coupled to ground through a respective capacitor, wherein the sensor diode means operating in the square law region and sensing the power levels over the wide dynamic ranges of the received RF signals, wherein the high power sensor path senses an RF input signal voltage proportional to R2/(R1+R2) times the input RF signal voltage, and wherein said sensor further includes switch means connected to the output of the low power sensor path such that DC voltages can be switched onto the low path diode outputs to reverse bias the low path diode pairs when the low power path is not being used and the high power path is being used for measurements.

4. The power sensor as in claim 3 including impedance means having a capacitor connected in parallel with resistor R2 and ground and an inductor connected in series with resistor R2 and ground, the impedance forming an impedance ratio of Z2/(Z1+Z2).

5. A diode stack microwave power sensor network comprising:

input means for receiving RF input signals from a source characterized by a transmission line impedance;

a low power sensor path connected to the input means for sensing relatively low power RF input signals, the low power sensor path including first stacked RF diode means having a first number of diode pairs coupled to ground through receptive capacitors; and an impedance network including a number of attenuating resistors R1, R2, . . . RN and ground for sensing different levels of attenuated relatively higher power RF input signals, the higher power sensor paths each including second stacked RF diode means having an arbitrary number of diode pairs coupled to ground through a respective capacitor, said impedance network providing a path to ground having an impedance equal to said transmission line impedance, wherein, the sensor diode operating means in the square law region and sensing the power levels over the wide dynamic ranges of the received RF signals.

* * * * *